United States Patent
Kim

(10) Patent No.: US 10,928,015 B2
(45) Date of Patent: Feb. 23, 2021

(54) LIGHT-EMITTING DIODE PACKAGE

(71) Applicant: LG INNOTEK CO., LTD., Seoul (KR)

(72) Inventor: Ki Hyun Kim, Seoul (KR)

(73) Assignee: LG INNOTEK CO., LTD., Seoul (KR)

(*) Notice: Subject to any disclaimer, the term of this patent is extended or adjusted under 35 U.S.C. 154(b) by 110 days.

(21) Appl. No.: 15/577,592

(22) PCT Filed: May 12, 2016

(86) PCT No.: PCT/KR2016/004984
§ 371 (c)(1),
(2) Date: Nov. 28, 2017

(87) PCT Pub. No.: WO2016/204408
PCT Pub. Date: Dec. 22, 2016

(65) Prior Publication Data
US 2018/0163933 A1    Jun. 14, 2018

(30) Foreign Application Priority Data

Jun. 15, 2015 (KR) .......................... 10-2015-0084513

(51) Int. Cl.
*F21K 9/68* (2016.01)
*F21Y 115/10* (2016.01)
(Continued)

(52) U.S. Cl.
CPC ................. *F21K 9/68* (2016.08); *F21K 9/69* (2016.08); *H01L 33/60* (2013.01);
(Continued)

(58) Field of Classification Search
CPC ................................ F21V 13/02; F21V 13/04
(Continued)

(56) References Cited

U.S. PATENT DOCUMENTS

2004/0207999 A1    10/2004    Suehiro et al.
2010/0051984 A1    3/2010    West
(Continued)

FOREIGN PATENT DOCUMENTS

CN    102144307 A    8/2011
JP    2004-281605 A    10/2004
(Continued)

*Primary Examiner* — William J Carter
(74) *Attorney, Agent, or Firm* — Birch, Stewart, Kolasch & Birch, LLP

(57) ABSTRACT

The present invention relates to a light-emitting diode package comprising: a base having a seating surface; a light-emitting diode arranged on the seating surface; a lens arranged on the seating surface such that the lens covers the light-emitting diode; and a reflective part arranged on the seating surface such that the reflective part is spaced apart from the lens, and formed with a preset inclination angle ($\theta$), wherein the inclination angle ($\theta$) can be set according to a separation distance between the lens and the reflective part. Therefore, the light-emitting diode package can minimize a change in a beam angle and a field angle by comprising the reflective part formed with an inclination angle set as a predetermined angle according to the separation distance between the lens and the reflective part.

7 Claims, 2 Drawing Sheets

(51) Int. Cl.
  *H01L 33/60*    (2010.01)
  *F21K 9/69*     (2016.01)
  *H01L 33/54*    (2010.01)

(52) U.S. Cl.
  CPC ........... *F21Y 2115/10* (2016.08); *H01L 33/54* (2013.01); *H01L 2224/48091* (2013.01)

(58) Field of Classification Search
  USPC ........................................................ 362/327
  See application file for complete search history.

(56) References Cited

U.S. PATENT DOCUMENTS

| | | | | |
|---|---|---|---|---|
| 2010/0181582 A1* | 7/2010 | Li | ........................... | H01L 33/44 |
| | | | | 257/91 |
| 2012/0134178 A1 | 5/2012 | Park | | |
| 2013/0010495 A1 | 1/2013 | Moon et al. | | |
| 2014/0312371 A1* | 10/2014 | Wong | .................. | F21V 33/0004 |
| | | | | 362/154 |

FOREIGN PATENT DOCUMENTS

| | | | |
|---|---|---|---|
| JP | 2014-212329 A | 11/2014 | |
| KR | 10-2013-0007275 A | 1/2013 | |
| KR | 10-2013-0070722 A | 6/2013 | |
| KR | 10-2015-0042161 A | 4/2015 | |

\* cited by examiner

【Figure 1】
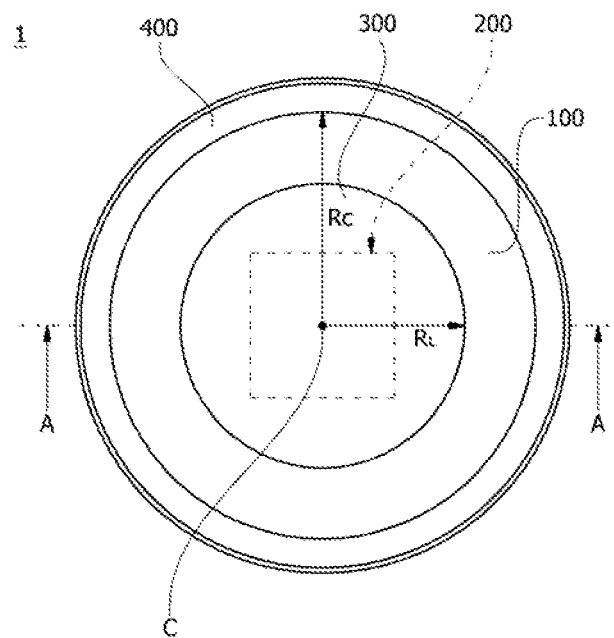
【Figure 2】
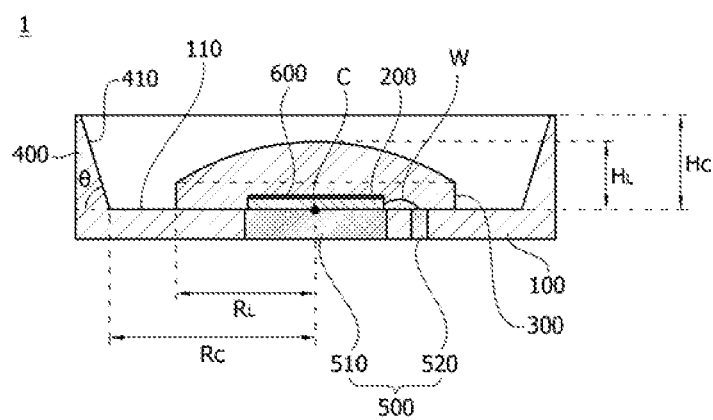

[Figure 3]
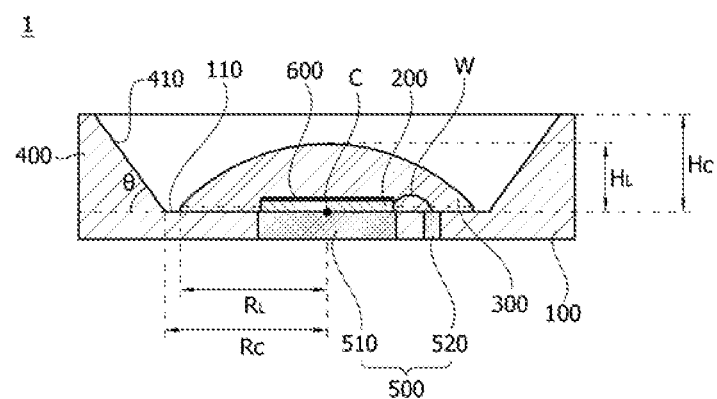
[Figure 4]
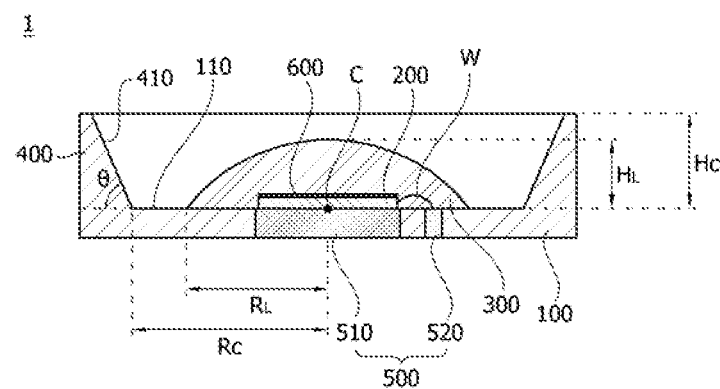

LIGHT-EMITTING DIODE PACKAGE

CROSS REFERENCE TO RELATED APPLICATIONS

This application is the National Phase of PCT International Application No. PCT/KR2016/004984, filed on May 12, 2016, which claims priority under 35 U.S.C. 119(a) to Patent Application No. 10-2015-0084513, filed in the Republic of Korea on Jun. 15, 2015, all of which are hereby expressly incorporated by reference into the present application.

TECHNICAL FIELD

The present invention relates to a light-emitting diode (LED) package.

BACKGROUND ART

Generally, light-emitting diodes (LEDs) have advantages in terms of output, efficiency, or reliability as light sources. Accordingly, LEDs are being actively researched and developed as high power and efficiency light sources for various lighting devices as well as backlights of display devices.

In order to use the LED as a light source for lighting, it is necessary to increase light efficiency and lower a manufacturing cost of the LED while a desirably high level of output is provided.

Therefore, the LED serving as a light source for lighting requires high efficiency and reliability, and should exhibit optical characteristics as well as electric and thermal reliability.

Recently, luminance of an LED is being gradually increased so that the LED is being used as a light source for displays, lighting, or a light source for automobiles. An LED which emits white light having high efficiency may be implemented by using a fluorescent material or by combining LEDs of various colors.

Specifically, when manufacturing an LED package using the LED as a light source, a lens may be used to increase efficiency and adjust a light distribution characteristic of the LED.

However, when a primary lens for improving a rearward light distribution characteristic is used as the lens, there is a problem in that errors occur in a beam angle and a field angle due to a lens shape tolerance.

DISCLOSURE

Technical Problem

The present invention is directed to providing a light-emitting diode (LED) package including a reflective part formed with an inclination angle set to be a predetermined angle according to a separation distance between a lens and the reflective part.

The scope of the present invention is not limited to the above-described object, and other unmentioned objects may be clearly understood by those skilled in the art from the following descriptions.

Technical Solution

One aspect of the present invention provides a light-emitting diode (LED) package including a base including a seating surface, an LED arranged on the seating surface, a lens arranged on the seating surface to cover the LED, and a reflective part arranged on the seating surface to be spaced apart from the lens, and formed with a preset inclination angle ($\theta$), wherein the inclination angle ($\theta$) is set according to a separation distance between the lens and the reflective part.

A cylinder rate, which is a separation distance ratio, may be obtained by the following equation:

$$\text{Cylinder rate} = R_C / R_L$$

$R_L$: a distance from a center of the lens to a corner of the lens with respect to the seating surface, and $R_C$: a distance from the center of the lens to a corner of the reflective part with respect to the seating surface.

Further, when the cylinder rate is less than 1.3, the inclination angle ($\theta$) may range from 40 to 60°.

Further, when the cylinder rate is 1.3 or more, the inclination angle ($\theta$) may range from 60 to 75°.

Further, a height of the lens may be smaller than a height of the reflective part with respect to the seating surface.

Here, a ratio of the height of the reflective part to the height of the lens may ranges from 1.2 to 1.5.

Meanwhile, the lens may be a primary lens.

Further, the lens may be formed of a silicon material having a refractive index of 1.4 to 1.5.

Advantageous Effects

A light-emitting diode (LED) package according to an embodiment of the present invention includes a reflective part formed with an inclination angle set to be a predetermined angle according to a separation distance between a lens and the reflective part, and thus can minimize a change in a beam angle and a field angle.

That is, the LED package can minimize a change in the beam angle and the field angle using the reflective part formed with the inclination angle set to be the predetermined angle according to the separation distance between the lens and the reflective part regardless of a shape of the lens and a lens curvature or conic value thereof.

DESCRIPTION OF DRAWINGS

FIG. 1 is a view illustrating a light-emitting diode (LED) package according to an embodiment of the present invention.

FIG. 2 is a cross-sectional view illustrating the LED package according to the embodiment and taken along line A-A of FIG. 1.

FIG. 3 is a cross-sectional view illustrating an LED package according to another embodiment and taken along line A-A of FIG. 1.

FIG. 4 is a cross-sectional view illustrating an LED package according to still another embodiment and taken along line A-A of FIG. 1.

MODES OF THE INVENTION

While the present invention is susceptible to various modifications and alternative forms, specific embodiments thereof are shown by way of example in the drawings and will herein be described in detail. However, it should be understood that there is no intent to limit the present invention to the particular forms disclosed, but that the present invention is to cover all modifications, equivalents, and alternatives falling within the spirit and scope of the present invention.

It should be understood that, although the terms "first," "second," etc. may be used herein to describe various elements, these elements are not limited by these terms. These terms are only used to distinguish one element from another. For example, a first element could be termed a second element, and, similarly, a second element could be termed a first element without departing from the scope of the present invention. As used herein, the term "and/or" includes any and all combinations of one or more of the associated listed items.

It should be understood that, when an element is referred to as being "connected" or "coupled" to another element, the element can be directly connected or coupled to the other element or intervening elements may be present. In contrast, when an element is referred to as being "directly connected" or "directly coupled" to another element, no intervening elements are present. Other words used to describe the relationship between elements should be interpreted in a like fashion (i.e., "between" versus "directly between," "adjacent" versus "directly adjacent," etc.).

In an embodiment, when an element is referred to as being formed "on" or "under" another element, the description includes the meaning of the two elements being in direct contact with each or the element being indirectly on or under the other element by one or more elements being interposed therebetween. Further, when an element is referred to as being formed "on" or "under" another element, the description may include the meaning of the other element being "formed in an upward direction of the element" and "formed in a downward direction of the element."

The terminology used herein is for the purpose of describing particular embodiments only and is not intended to limit the present invention. As used herein, the singular forms "a" and "an" are intended to include the plural forms as well unless the context clearly indicates otherwise. It should be further understood that the terms "comprise," "comprising," "include," and/or "including," when used herein, specify the presence of stated features, integers, steps, operations, elements, parts, and/or combinations thereof, but do not preclude the presence or addition of one or more other features, integers, steps, operations, elements, parts, and/or combinations thereof.

Unless otherwise defined, all terms (including technical and scientific terms) used herein have the same meaning as commonly understood by one of ordinary skill in the art to which this invention belongs. It should be further understood that terms, such as those defined in commonly used dictionaries, should be interpreted as having a meaning that is consistent with their meaning in the context of the relevant art and are not to be interpreted in an idealized or overly formal sense unless expressly defined as such herein.

Hereinafter, embodiments will be described in detail with reference to the accompanying drawings, the same or corresponding components are denoted by the same reference numerals regardless of reference numbers, and thus descriptions thereof will not be repeated.

Referring to FIGS. 1 to 4, each of light-emitting diode (LED) packages 1 according to embodiments may include a base 100, an LED 200, a lens 300, a reflective part 400, and a lid frame 500.

The base 100 may include a seating surface 110.

As illustrated in FIG. 2, the LED 200, the lens 300, and the reflective part 400 may be arranged on the seating surface 110. Here, the reflective part 400 may be formed to protrude from the base 100 in a light emission direction of the LED 200 with respect to the seating surface 110 of the base 100.

As illustrated in FIG. 1, the base 100 has a circular shape in a top view, but the present invention is not limited thereto, and the base 100 may have various shapes such as an elliptical shape, a rectangular shape, a polygonal shape, and the like.

The base 100 may be formed of at least one of a resin material such as polyphthalamide (PPA), silicon (Si), aluminum (Al), aluminum nitride (AlN), phosphosilicate glass (PSG, photo sensitive glass), polyamide 9T (PA9T), syndiotactic polystyrene (SPS), a metal material, sapphire ($Al_2O_3$), beryllium oxide (BeO), a printed circuit board (PCB), and ceramics.

Additionally, the base 100 may be formed of a material which efficiently reflects light, or a surface thereof may be formed to have a color (e.g., white, silver, or the like) which efficiently reflects the light.

The seating surface 110 of the base 100 may be formed of a material whose surface efficiently reflects light, or may be coated with a color (e.g., white, silver, or the like) which efficiently reflects light.

The base 100 may be formed by injection molding, etching, and the like, but the present invention is not limited thereto.

The LED 200 is a light source which emits light and may be electrically connected to the base 100. For example, as illustrated in FIGS. 2 to 4, the LED 200 may be electrically connected to a power source (not illustrated) by arranging the lid frame 500 on the base 100.

Here, the lid frame 500 may include a first lid frame 510 arranged on a lower side of the LED 200 and a second lid frame 520 arranged on the base 100 to be spaced apart from the first lid frame 510. The LED 200 and the second lid frame 520 may be electrically connected by a wire W, but the present invention is not limited thereto.

The LED 200 may be arranged on the seating surface 110 of the base 100, for example, on a center of the seating surface 110.

Here, the LED 200 may be an LED chip which emits light such as red light, green light, blue light, ultraviolet (UV) light, or the like. The LED 200 may be a horizontal type LED, a vertical type LED, a flip chip type LED, or the like.

As illustrated in FIGS. 2 and 3, the lens 300 may be arranged on the seating surface 110 to cover the LED 200.

The lens 300 may change a directivity angle of light emitted from the LED 200. For example, the lens 300 may increase the directivity angle of the light emitted from the LED 200 to uniformly emit the light from the LED package 1, but the present invention is not limited thereto.

The lens 300 may have various shapes by changing an aspherical surface coefficient thereof. For example, referring to FIGS. 2 and 3, the lens 300 may include a cylindrical first portion formed on the seating surface 110 in a vertical direction, and a second portion formed on the first portion to have a convex emission surface.

As illustrated in FIGS. 2 and 3, the first portion of the lens 300 may be formed to be higher or lower than the LED 200, and a shape of the emission surface of the second portion may also be formed differently. Light distribution of the lens 300 may be adjusted by changing a height of the first portion and a curvature of the second portion.

Further, as illustrated in FIG. 4, the lens 300 may be formed to include only the second portion without forming the first portion. For example, the lens 300 may be formed to have a dome shape, but the present invention is not limited thereto.

The lens 300 may be formed of an epoxy resin, a silicone resin, a urethane-based resin, or a mixture thereof. For example, the lens 300 may be formed of a silicon material having a refractive index of 1.4 to 1.5.

Here, a primary lens having a predetermined beam angle may be used as the lens 300. Here, the primary lens may refer to a lens having no space such as an air gap because the LED 200 and the lens 300 are not spaced apart from each other.

The reflective part 400 may reflect the light emitted from the LED 200 in a predetermined direction. Accordingly, an amount of light directed toward the light emission surface may be increased.

Referring to FIGS. 2 and 3, the reflective part 400 may be formed to protrude from the base 100 in the light emission direction of the LED 200.

For example, the reflective part 400 may be arranged on the seating surface 110 of the base 100. Further, a reflective surface 410 may be formed inside the reflective part 400. Therefore, as illustrated in FIGS. 2 and 3, a reflection angle of the light emitted from the LED 200 may vary according an inclination angle θ of the reflective surface 410, and accordingly, a directivity angle of light emitted to the outside may be adjusted.

The reflective part 400 may be formed of a material having high reflectivity. Further, a reflective sheet may be attached to the reflective surface 410 of the reflective part 400, or a material having high reflectivity may be arranged on the reflective surface 410 as a reflective layer or the like. However, the present invention is not limited thereto.

Further, a shape of the reflective part 400 in a top view of the LED package 1 may be a shape such as a circular shape, a rectangular shape, a polygonal shape, an elliptical shape, or the like. For example, the reflective part 400 may be formed to have the same shape as the base 100, but the present invention is not limited thereto.

The reflective part 400 may form a cavity. An inside of the cavity may be an empty space, but the present invention is not limited thereto, and a separate encapsulant may be arranged inside the cavity.

Meanwhile, the reflective part 400 may be arranged to be spaced apart from one side of the lens 300.

A separation distance between one side of the lens 300 and one side of the reflective part 400 may be represented as a cylinder rate (CR).

Referring to FIGS. 2 and 3, the cylinder rate (CR) with respect to a center C of the lens 300 may be obtained by Equation 1 below. Here, the center C of the lens 300 may refer to a center of a surface in which the lens 300 is in contact with the seating surface 110 of the base 100.

$$CR = R_C / R_L \quad \text{[Equation 1]}$$

$R_L$: a distance from the center of the lens to a corner of the lens with respect to the seating surface, and $R_C$: a distance from the center of the lens to a corner of the reflective part with respect to the seating surface.

As illustrated in FIGS. 2 and 3, the lens 300 may be formed to have a height $H_L$ lower than of a height $H_C$ of the reflective part 400.

Here, a ratio of the height $H_L$ of the lens 300 to the height $H_C$ of the reflective part 400 may be represented as a height rate (HR).

Referring to FIGS. 2 and 3, the height rate (HR) with respect to the center C of the lens 300 may be obtained by Equation 2 below.

$$HR = H_C / H_L \quad \text{[Equation 2]}$$

$H_L$: the height of the lens with respect to the seating surface, and $H_C$: the height of the reflective part with respect to the seating surface.

Hereinafter, changes and maximum deviations of a beam angle and a field angle according to changes in the shape of the lens 300 and the inclination angle will be described. The shape of the lens may be changed by changing the aspherical surface coefficient thereof, for example, a curvature value, a conic value, or the like. However, in the present embodiment, the change of the shape of the lens will be described by changing the conic value.

TABLE 1

| Inclination Angle (θ) | FA (Conic Value −1) | FA (Conic Value 0) | FA (Conic Value 1) | BA (Conic Value −1) | BA (Conic Value 0) | BA (Conic Value 1) | FA Maximum Deviation | BA Maximum Deviation |
|---|---|---|---|---|---|---|---|---|
| 20 | 163.405 | 163.688 | 163.835 | 139.706 | 143.712 | 146.841 | 0.283 | 4.006 |
| 25 | 159.906 | 159.927 | 160.025 | 139.077 | 141.625 | 143.523 | 0.098 | 2.548 |
| 30 | 158.76 | 158.819 | 159.015 | 136.337 | 139.387 | 140.827 | 0.196 | 3.05 |
| 35 | 157.791 | 157.982 | 158.024 | 134.289 | 135.929 | 136.791 | 0.191 | 1.64 |
| 40 | 157.1 | 157.38 | 157.467 | 133.301 | 134.446 | 134.949 | 0.28 | 1.145 |
| 45 | 156.951 | 157.208 | 157.248 | 132.713 | 133.55 | 133.595 | 0.257 | 0.837 |
| 50 | 156.791 | 157.394 | 157.551 | 132.086 | 133.227 | 133.301 | 0.603 | 1.141 |
| 55 | 156.699 | 157.193 | 157.681 | 130.826 | 132.135 | 132.171 | 0.494 | 1.309 |
| 60 | 156.948 | 157.504 | 158.177 | 130.121 | 131.028 | 131.129 | 0.673 | 0.907 |
| 65 | 157.335 | 158.566 | 158.583 | 129.039 | 130.498 | 130.17 | 1.231 | 1.459 |
| 70 | 157.898 | 159.269 | 159.754 | 128.501 | 129.969 | 129.967 | 1.371 | 1.468 |
| 75 | 159.262 | 159.984 | 160.784 | 128.034 | 129.563 | 129.373 | 0.8 | 1.529 |
| 80 | 160.484 | 161.23 | 161.75 | 127.17 | 128.902 | 128.787 | 0.746 | 1.732 |
| 85 | 161.074 | 162.152 | 162.78 | 126.428 | 128.371 | 127.752 | 1.078 | 1.943 |
| 90 | 161.963 | 163.131 | 163.389 | 125.152 | 126.435 | 126.119 | 1.168 | 1.283 |

Table 1 illustrates an amount of changes in a beam angle (BA) and a field angle (FA) according to an inclination angle θ when a cylinder rate is 1.1 and a height rate is 1.5.

Since light emitted in a direction perpendicular to a light-emitting surface of the LED 200 has the strongest luminous intensity, an angle having 50% of the strongest luminous intensity may be referred to as a beam angle while an angle having 10% of the strongest luminous intensity may be referred to as a field angle. For example, when it is assumed that luminous intensity is the strongest at 0 degrees in a range of −90 degrees to 90 degrees, the beam angle may be 120 degrees when the angle is 60 degrees in a 50% range.

Here, the amount of changes in the beam angle may be represented by a difference between beam angles when conic values are −1, 0, and 1 at each inclination angle θ. Further, the amount of changes in the field angle may be represented by a difference between field angles when conic values are −1, 0, and 1 at each of the inclination angles θ.

The maximum deviation of the beam angle and the maximum deviation of the field angle may be obtained by a difference between maximum values among (K(−1)−K(0)) and (K(1)−K(0)) for each beam angle and field angle (K: a conic value).

TABLE 2

| Inclination Angle (θ) | FA (Conic Value −1) | FA (Conic Value 0) | FA (Conic Value 1) | BA (Conic Value −1) | BA (Conic Value 0) | BA (Conic Value 1) | FA Maximum Deviation | BA Maximum Deviation |
|---|---|---|---|---|---|---|---|---|
| 20 | 164.283 | 164.514 | 164.671 | 139.831 | 144.517 | 148.56 | 0.231 | 4.686 |
| 25 | 161.53 | 161.595 | 161.816 | 139.635 | 142.354 | 144.686 | 0.221 | 2.719 |
| 30 | 159.487 | 159.601 | 159.66 | 137.984 | 140.838 | 142.38 | 0.114 | 2.854 |
| 35 | 158.6 | 158.632 | 158.707 | 135.693 | 137.953 | 139.029 | 0.075 | 2.26 |
| 40 | 157.921 | 158.11 | 158.237 | 134.653 | 136.111 | 136.868 | 0.189 | 1.458 |
| 45 | 157.754 | 157.978 | 157.987 | 134.486 | 135.729 | 136.097 | 0.224 | 1.243 |
| 50 | 157.539 | 158.04 | 158.225 | 134.055 | 135.38 | 135.524 | 0.501 | 1.325 |
| 55 | 157.33 | 157.867 | 158.327 | 133.11 | 134.403 | 134.618 | 0.537 | 1.293 |
| 60 | 157.444 | 157.988 | 158.466 | 132.476 | 133.36 | 133.6 | 0.544 | 0.884 |
| 65 | 157.678 | 158.781 | 158.902 | 131.448 | 132.755 | 132.632 | 1.103 | 1.307 |
| 70 | 158.034 | 159.193 | 159.651 | 130.968 | 132.362 | 132.39 | 1.159 | 1.394 |
| 75 | 159.018 | 159.605 | 160.784 | 130.184 | 131.656 | 131.828 | 1.179 | 1.472 |
| 80 | 159.924 | 161.178 | 161.581 | 129.802 | 131.359 | 131.299 | 1.254 | 1.557 |
| 85 | 160.36 | 161.698 | 162.438 | 129.209 | 130.855 | 130.437 | 1.338 | 1.646 |
| 90 | 161.275 | 162.717 | 163.113 | 127.716 | 128.007 | 129.844 | 1.442 | 1.837 |

Table 2 illustrates an amount of changes in the beam angle 20 and the field angle according to the inclination angle θ when the cylinder rate is 1.2 and the height rate is 1.5.

TABLE 3

| Inclination Angle (θ) | FA (Conic Value −1) | FA (Conic Value 0) | FA (Conic Value 1) | BA (Conic Value −1) | BA (Conic Value 0) | BA (Conic Value 1) | FA Maximum Deviation | BA Maximum Deviation |
|---|---|---|---|---|---|---|---|---|
| 20 | 164.958 | 165.225 | 165.347 | 140.021 | 145.403 | 150.223 | 0.267 | 5.382 |
| 25 | 162.749 | 162.947 | 163.153 | 139.829 | 143.069 | 145.774 | 0.206 | 3.24 |
| 30 | 160.432 | 160.675 | 160.904 | 138.921 | 141.697 | 143.716 | 0.243 | 2.776 |
| 35 | 159.327 | 159.383 | 159.388 | 137.288 | 140.171 | 140.997 | 0.056 | 2.883 |
| 40 | 158.636 | 158.79 | 158.86 | 136.225 | 138.156 | 139.029 | 0.154 | 1.931 |
| 45 | 158.514 | 158.673 | 158.731 | 136.116 | 137.595 | 138.117 | 0.159 | 1.479 |
| 50 | 158.187 | 158.582 | 158.803 | 135.527 | 137.184 | 137.526 | 0.395 | 1.657 |
| 55 | 158.013 | 158.457 | 158.79 | 134.889 | 136.459 | 136.756 | 0.444 | 1.57 |
| 60 | 158.093 | 158.524 | 158.826 | 134.609 | 135.556 | 135.81 | 0.431 | 0.947 |
| 65 | 158.256 | 159.023 | 159.277 | 133.767 | 135.055 | 135.042 | 0.767 | 1.288 |
| 70 | 158.275 | 159.195 | 159.514 | 133.299 | 134.57 | 134.579 | 0.92 | 1.271 |
| 75 | 158.821 | 159.451 | 159.987 | 132.712 | 134.081 | 134.091 | 0.63 | 1.369 |
| 80 | 159.469 | 160.777 | 160.916 | 132.124 | 133.718 | 133.694 | 1.308 | 1.594 |
| 85 | 159.865 | 161.112 | 162.172 | 131.585 | 132.982 | 132.864 | 1.247 | 1.397 |
| 90 | 160.618 | 162.138 | 162.812 | 130.288 | 131.565 | 131.765 | 1.52 | 1.277 |

Table 3 illustrates the amount of changes in the beam angle and the field angle according to the inclination angle θ when the cylinder rate is 1.3 and the height rate is 1.5.

TABLE 4

| Inclination Angle (θ) | FA (Conic Value −1) | FA (Conic Value 0) | FA (Conic Value 1) | BA (Conic Value −1) | BA (Conic Value 0) | BA (Conic Value 1) | FA Maximum Deviation | BA Maximum Deviation |
|---|---|---|---|---|---|---|---|---|
| 20 | 165.552 | 165.797 | 165.877 | 140.214 | 146.169 | 150.935 | 0.245 | 5.955 |
| 25 | 163.78 | 164.011 | 164.21 | 140.224 | 143.742 | 147.2 | 0.231 | 3.518 |
| 30 | 161.973 | 162.133 | 162.54 | 139.414 | 142.388 | 144.865 | 0.407 | 2.974 |
| 35 | 160.005 | 160.172 | 160.119 | 138.767 | 141.117 | 142.362 | 0.167 | 2.35 |
| 40 | 159.36 | 159.461 | 159.55 | 138.004 | 140.378 | 141.135 | 0.101 | 2.374 |
| 45 | 159.206 | 159.294 | 159.336 | 138.047 | 139.916 | 140.468 | 0.088 | 1.869 |
| 50 | 158.811 | 159.222 | 159.418 | 137.141 | 139.184 | 139.435 | 0.411 | 2.043 |
| 55 | 158.655 | 158.98 | 159.292 | 136.549 | 138.325 | 138.776 | 0.325 | 1.776 |
| 60 | 158.578 | 158.967 | 159.255 | 136.154 | 137.422 | 137.975 | 0.389 | 1.268 |
| 65 | 158.622 | 159.403 | 159.539 | 135.764 | 137.06 | 137.169 | 0.781 | 1.296 |
| 70 | 158.695 | 159.41 | 159.723 | 135.65 | 136.983 | 136.597 | 0.715 | 1.333 |
| 75 | 159.042 | 159.467 | 159.805 | 134.804 | 136.127 | 136.339 | 0.425 | 1.323 |
| 80 | 159.166 | 160.17 | 160.519 | 134.417 | 135.721 | 135.842 | 1.004 | 1.304 |
| 85 | 159.509 | 160.784 | 161.865 | 133.841 | 135.146 | 135.046 | 1.275 | 1.305 |
| 90 | 159.847 | 161.317 | 162.589 | 132.488 | 133.951 | 133.896 | 1.47 | 1.463 |

Table 4 illustrates the amount of changes in the beam angle and the field angle according to the inclination angle θ when the cylinder rate is 1.4 and the height rate is 1.5.

TABLE 5

| Inclination Angle (θ) | FA (Conic Value −1) | FA (Conic Value 0) | FA (Conic Value 1) | BA (Conic Value −1) | BA (Conic Value 0) | BA (Conic Value 1) | FA Maximum Deviation | BA Maximum Deviation |
|---|---|---|---|---|---|---|---|---|
| 20 | 166.063 | 166.263 | 166.355 | 140.427 | 146.976 | 151.53  | 0.2   | 6.549 |
| 25 | 164.591 | 164.774 | 164.997 | 140.246 | 144.608 | 148.962 | 0.223 | 4.362 |
| 30 | 163.088 | 163.332 | 163.713 | 139.566 | 143.092 | 146.021 | 0.381 | 3.526 |
| 35 | 161.545 | 161.677 | 161.81  | 139.466 | 141.812 | 143.534 | 0.133 | 2.346 |
| 40 | 160.038 | 160.371 | 160.405 | 139.709 | 141.512 | 142.648 | 0.333 | 1.803 |
| 45 | 159.851 | 159.925 | 160.065 | 140.027 | 141.303 | 142.279 | 0.14  | 1.276 |
| 50 | 159.456 | 159.745 | 159.902 | 139.462 | 141.029 | 141.397 | 0.289 | 1.567 |
| 55 | 159.305 | 159.553 | 159.767 | 138.922 | 140.428 | 140.703 | 0.248 | 1.506 |
| 60 | 159.171 | 159.491 | 159.65  | 137.969 | 139.453 | 139.933 | 0.32  | 1.484 |
| 65 | 159.117 | 159.684 | 159.787 | 137.575 | 139.022 | 139.207 | 0.567 | 1.447 |
| 70 | 159.05  | 159.697 | 159.968 | 136.938 | 138.351 | 138.636 | 0.647 | 1.413 |
| 75 | 159.209 | 159.694 | 160.094 | 136.596 | 138.079 | 138.412 | 0.485 | 1.483 |
| 80 | 159.299 | 160.381 | 160.524 | 136.203 | 137.697 | 137.918 | 1.082 | 1.494 |
| 85 | 159.425 | 160.544 | 161.657 | 135.756 | 137.009 | 137.169 | 1.119 | 1.253 |
| 90 | 159.576 | 160.917 | 162.344 | 134.609 | 135.952 | 136.163 | 1.427 | 1.343 |

Table 5 illustrates the amount of changes in the beam angle and the field angle according to the inclination angle θ when the cylinder rate is 1.5 and the height rate is 1.5.

TABLE 6

| Inclination Angle (θ) | FA (Conic Value −1) | FA (Conic Value 0) | FA (Conic Value 1) | BA (Conic Value −1) | BA (Conic Value 0) | BA (Conic Value 1) | FA Maximum Deviation | BA Maximum Deviation |
|---|---|---|---|---|---|---|---|---|
| 20  | 169.412 | 169.403 | 169.377 | 141.026 | 148.877 | 154.395 | 0.026 | 7.851 |
| 25  | 168.38  | 168.385 | 168.394 | 140.361 | 148.33  | 152.812 | 0.009 | 7.969 |
| 30  | 167.596 | 167.609 | 167.688 | 140.812 | 147.023 | 151.311 | 0.079 | 6.211 |
| 35  | 166.948 | 167.022 | 167.052 | 140.253 | 145.027 | 149.546 | 0.074 | 4.774 |
| 40  | 166.372 | 166.488 | 166.433 | 139.972 | 143.589 | 146.285 | 0.116 | 3.617 |
| 45  | 165.981 | 166.113 | 166.084 | 140.787 | 143.532 | 145.264 | 0.132 | 2.745 |
| 50θ | 165.681 | 165.893 | 165.881 | 141.49  | 143.772 | 145.077 | 0.212 | 2.282 |
| 55  | 165.549 | 165.763 | 165.77  | 141.706 | 143.582 | 144.58  | 0.214 | 1.876 |
| 60  | 165.263 | 165.554 | 165.755 | 141.531 | 142.976 | 143.92  | 0.291 | 1.445 |
| 65  | 165.178 | 165.379 | 165.619 | 141.323 | 142.756 | 143.245 | 0.24  | 1.433 |
| 70  | 165.099 | 165.399 | 165.472 | 141.007 | 142.469 | 142.583 | 0.3   | 1.462 |
| 75  | 164.886 | 165.475 | 165.549 | 140.449 | 141.932 | 142.156 | 0.589 | 1.483 |
| 80  | 164.871 | 165.353 | 165.414 | 140.511 | 142.073 | 141.827 | 0.482 | 1.562 |
| 85  | 164.902 | 165.477 | 165.628 | 139.615 | 142.301 | 141.397 | 0.575 | 2.686 |
| 90  | 164.891 | 165.358 | 165.655 | 138.503 | 142.325 | 140.328 | 0.467 | 3.822 |

Table 6 illustrates the amount of changes in the beam angle and the field angle according to the inclination angle θ when the cylinder rate is 1.3 and the height rate is 1.2.

TABLE 7

| Inclination Angle (θ) | FA (Conic Value −1) | FA (Conic Value 0) | FA (Conic Value 1) | BA (Conic Value −1) | BA (Conic Value 0) | BA (Conic Value 1) | FA Maximum Deviation | BA Maximum Deviation |
|---|---|---|---|---|---|---|---|---|
| 20 | 167.905 | 167.994 | 167.992 | 140.782 | 148.591 | 152.871 | 0.089 | 7.809 |
| 25 | 166.73  | 166.883 | 166.963 | 140.148 | 146.381 | 151.167 | 0.153 | 6.233 |
| 30 | 165.783 | 166.011 | 166.072 | 140.14  | 144.753 | 148.424 | 0.228 | 4.613 |
| 35 | 165.009 | 165.192 | 165.39  | 139.791 | 143.29  | 146.004 | 0.198 | 3.499 |
| 40 | 164.304 | 164.405 | 164.455 | 140.099 | 142.119 | 143.8   | 0.101 | 2.02  |
| 45 | 163.721 | 163.838 | 164.048 | 140.39  | 141.979 | 143.171 | 0.21  | 1.589 |
| 50 | 163.478 | 163.615 | 163.649 | 140.683 | 141.888 | 142.727 | 0.137 | 1.205 |
| 55 | 162.726 | 163.388 | 163.541 | 139.758 | 141.301 | 141.889 | 0.662 | 1.543 |
| 60 | 162.437 | 163.015 | 163.296 | 139.422 | 140.845 | 141.111 | 0.578 | 1.423 |
| 65 | 162.2   | 162.527 | 162.978 | 138.749 | 140.162 | 140.371 | 0.451 | 1.413 |
| 70 | 162.284 | 162.838 | 162.944 | 138.346 | 139.795 | 139.833 | 0.554 | 1.449 |

TABLE 7-continued

| Inclination Angle (θ) | FA (Conic Value −1) | FA (Conic Value 0) | FA (Conic Value 1) | BA (Conic Value −1) | BA (Conic Value 0) | BA (Conic Value 1) | FA Maximum Deviation | BA Maximum Deviation |
|---|---|---|---|---|---|---|---|---|
| 75 | 162.067 | 162.672 | 162.994 | 137.857 | 139.329 | 139.315 | 0.605 | 1.472 |
| 80 | 162.01 | 162.785 | 163.061 | 137.585 | 139.148 | 139.116 | 0.775 | 1.563 |
| 85 | 162.132 | 162.887 | 163.338 | 136.904 | 138.463 | 138.497 | 0.755 | 1.559 |
| 90 | 162.16 | 162.995 | 163.596 | 135.882 | 137.282 | 137.293 | 0.835 | 1.4 |

Table 7 illustrates the amount of changes in the beam angle and the field angle according to the inclination angle θ when the cylinder rate is 1.3 and the height rate is 1.3.

TABLE 8

| Inclination Angle (θ) | FA (Conic Value −1) | FA (Conic Value 0) | FA (Conic Value 1) | BA (Conic Value −1) | BA (Conic Value 0) | BA (Conic Value 1) | FA Maximum Deviation | BA Maximum Deviation |
|---|---|---|---|---|---|---|---|---|
| 20 | 166.527 | 166.7 | 166.739 | 140.444 | 146.95 | 151.651 | 0.173 | 6.506 |
| 25 | 165.073 | 165.276 | 165.442 | 140.335 | 144.598 | 148.724 | 0.203 | 4.263 |
| 30 | 163.746 | 163.943 | 164.17 | 139.615 | 142.98 | 145.599 | 0.227 | 3.365 |
| 35 | 162.397 | 162.415 | 162.714 | 139.292 | 141.592 | 143.335 | 0.299 | 2.3 |
| 40 | 161 | 161.215 | 161.153 | 138.201 | 140.726 | 141.526 | 0.215 | 2.525 |
| 45 | 160.213 | 160.549 | 160.031 | 138.415 | 140.517 | 140.805 | 0.518 | 2.102 |
| 50 | 159.747 | 159.969 | 159.891 | 137.717 | 139.546 | 139.982 | 0.222 | 1.829 |
| 55 | 159.459 | 159.744 | 160.101 | 136.975 | 138.864 | 139.103 | 0.357 | 1.889 |
| 60 | 159.392 | 159.703 | 159.774 | 136.604 | 138.099 | 138.299 | 0.311 | 1.495 |
| 65 | 159.274 | 159.685 | 159.866 | 136.047 | 137.505 | 137.58 | 0.411 | 1.458 |
| 70 | 159.358 | 159.785 | 160.116 | 135.798 | 136.922 | 136.899 | 0.427 | 1.124 |
| 75 | 159.543 | 159.812 | 160.315 | 135.259 | 136.587 | 136.788 | 0.503 | 1.328 |
| 80 | 159.613 | 160.585 | 161.223 | 134.888 | 136.402 | 136.235 | 0.972 | 1.514 |
| 85 | 160 | 160.695 | 161.917 | 134.254 | 135.863 | 135.479 | 1.222 | 1.609 |
| 90 | 160.19 | 161.525 | 162.575 | 132.973 | 134.583 | 134.336 | 1.335 | 1.61 |

Table 8 illustrates the amount of changes in the beam angle and the field angle according to the inclination angle θ when the cylinder rate is 1.3 and the height rate is 1.4.

When the maximum deviation of the field angle is 1.0 or less and the maximum deviation of the beam angle is 1.5 or less, a uniform beam pattern and light may be emitted even when the shape of the lens is changed by changing the aspherical surface coefficient thereof.

Referring to Tables 1 to 5, in the LED package 1, since the maximum deviation of the beam angle and the maximum deviation of the field angle are 1.0 or less and 1.5 or less, respectively, at an inclination angle θ of 40° to 60° when the cylinder rate is less than 1.3 and at an inclination angle θ of 60° to 75° when the cylinder rate is 1.3 or more, an amount of changes in the beam angle and the field angle may be minimized.

Further, referring to Tables 3 and 6 to 8, in the LED package 1, the lens 300 and the reflective part 400 may be arranged such that the height rate HR is within a range of 1.2 to 1.5 in consideration of the height of the LED 200 and a ratio of the height of the reflective part 400 to the height of the lens 300. When the height rate HR is out of the above range, the maximum deviation of the field angle is more than 1.0 or the maximum deviation of the beam angle is more than 1.5, and thus it may be difficult to emit a uniform beam pattern and light when the shape of the lens is changed by changing the aspherical surface coefficient thereof.

Referring to FIGS. 2 to 4, an upper portion of the reflective part 400 may be formed to have a predetermined thickness. The thickness may be changed in consideration of an angle of the reflective surface of the reflective part 400, rigidity of the reflective part 400, a supporting force against a load, and the like in terms of design.

Meanwhile, the LED package 1 may further include a phosphor layer 600 arranged on an upper surface of the LED 200. Here, the phosphor layer 600 may be provided on the upper surface of the LED 200 to have a predetermined thickness. Alternatively, the phosphor layer 600 may be formed on the upper surface of the LED 200 to have a uniform thickness through conformal coating.

Here, the phosphor layer 600 may be formed of various fluorescent materials such as a sulfide-based material, a silicate-based material, an yttrium-aluminum-garnet (YAG)-based material, a nitric oxide-based material, a nitride-based material, and the like.

While the example embodiments of the present invention and their advantages have been described above in detail, it should be understood that various changes, substitutions, and alterations may be made herein without departing from the scope of the invention as defined by the following claims. It should be understood that differences related to the changes, substitutions, and alterations are included within the scope of the present invention as defined in the appended claims.

The invention claimed is:

1. A light-emitting diode (LED) package comprising:
   a base including a seating surface;
   an LED arranged on the seating surface;
   a lens arranged on the seating surface to cover the LED; and
   a reflective part integrally formed with the base and having a reflective surface, the reflective surface arranged on the seating surface to be spaced apart from the lens, and formed with a fixed angle of inclination between the seating surface and the reflective surface,
   wherein a cylinder rate, which is a separation distance ratio, is obtained by the following equation:

cylinder rate=$R_C/R_L$ $R_L$: a distance from a center of a bottom surface of the lens to an edge of the bottom surface of the lens, and $R_C$: a distance from the center of the bottom surface of the lens to a bottom edge of the reflective surface, wherein the fixed angle of inclination is directly proportional to a separation distance between the lens and the reflective part, wherein, when the cylinder rate is less than 1.3, the fixed angle of inclination ranges from 40 to 60°, wherein a height rate is obtained by the following equation:

$$\text{height rate} = H_C/H_L$$

$H_L$: a height of a center of the lens from the bottom surface of the lens, and $H_C$: a height of a top surface of the reflective part from the bottom surface of the lens, and wherein the height rate ranges from 1.2 to 1.5.

2. The LED package of claim 1, wherein the lens is a primary lens.

3. The LED package of claim 2, wherein the lens is formed of a silicon material having a refractive index of 1.4 to 1.5.

4. A light-emitting diode (LED) package comprising:
a base including a seating surface;
an LED arranged on the seating surface;
a lens arranged on the seating surface to cover the LED; and
a reflective part integrally formed with the base and having a reflective surface, the reflective surface arranged on the seating surface to be spaced apart from the lens, and formed with a fixed angle of inclination between the seating surface and the reflective surface,
wherein a cylinder rate, which is a separation distance ratio, is obtained by the following equation:

$$\text{cylinder rate} = R_C/R_L$$

$R_L$: a distance from a center of a bottom surface of the lens to an edge of the bottom surface of the lens, and $R_C$: a distance from the center of the bottom surface of the lens to a bottom edge of the reflective surface, wherein the fixed angle of inclination is directly proportional to a separation distance between the lens and the reflective part, and wherein, when the cylinder rate is 1.3 or more, the fixed angle of inclination ranges from 60 to 80°, wherein a height rate is obtained by the following equation:

$$\text{height rate} = H_C/H_L$$

$H_L$: a height of a center of the lens from the bottom surface of the lens, and $H_C$: a height of a top surface of the reflective part from the bottom surface of the lens, and wherein the height rate ranges from 1.2 to 1.5.

5. The LED package of claim 4, wherein the lens is a primary lens.

6. A light-emitting diode (LED) package comprising:
a base including a seating surface;
an LED arranged on the seating surface;
a lens arranged on the seating surface to cover the LED; and
a reflective part integrally formed with the base and having a reflective surface, the reflective surface arranged on the seating surface to be spaced apart from the lens, the reflective surface having a fixed angle of inclination between the seating surface and the reflective surface,
wherein the fixed angle of inclination is directly proportional to a separation distance between the lens and the reflective part,
wherein a height rate is obtained by the following equation:

$$\text{height rate} = H_C/H_L$$

$H_L$: a height of a center of the lens from a bottom surface of the lens, and $H_C$: a height of the reflective part from the bottom surface of the lens, and wherein the height rate ranges from 1.2 to 1.5.

7. The LED package of claim 6, wherein a cylinder rate, which is a separation distance ratio, is obtained by the following equation:

$$\text{cylinder rate} = R_C/R_L$$

wherein $R_L$ is a distance from a center of the bottom surface of the lens to an edge of the bottom surface of the lens, and $R_C$ a distance from the center of the bottom surface of the lens to a bottom edge of the reflective surface, and wherein the fixed angle of inclination ranges from 40 to 60° when the cylinder rate is less than 1.3 and the fixed angle of inclination ranges from 60 to 80° when the cylinder rate is 1.3 or more.

\* \* \* \* \*